United States Patent
Schmidt et al.

(10) Patent No.: US 6,221,784 B1
(45) Date of Patent: Apr. 24, 2001

(54) METHOD AND APPARATUS FOR SEQUENTIALLY ETCHING A WAFER USING ANISOTROPIC AND ISOTROPIC ETCHING

(75) Inventors: Ursula Schmidt, Dresden; Walter Schoenleber, Holzgerlingen; Michael Schmidt, Ottendorf-Okrilla, all of (DE)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/450,882

(22) Filed: Nov. 29, 1999

(51) Int. Cl.$^7$ .................................................. H01L 21/00
(52) U.S. Cl. .................. 438/719; 156/345; 216/67; 216/79; 438/723; 438/743
(58) Field of Search .................. 156/345 P; 216/67, 216/79; 438/710, 712, 719, 723, 724, 734, 743, 744

(56) References Cited

U.S. PATENT DOCUMENTS

| | | | |
|---|---|---|---|
| 4,310,380 | * 1/1982 | Flamm et al. | 438/719 |
| 4,484,978 | * 11/1984 | Keyer | 438/734 X |
| 4,666,555 | 5/1987 | Tsang | 156/643 |
| 4,726,879 | 2/1988 | Bondur et al. | 156/643 |
| 4,741,799 | 5/1988 | Chen et al. | 156/643 |
| 5,316,616 | * 5/1994 | Nakamura et al. | 438/719 X |
| 5,358,601 | 10/1994 | Cathey | 156/656 |
| 5,433,823 | 7/1995 | Cain | 156/662.1 |
| 5,658,472 | 8/1997 | Bartha et al. | 216/2 |
| 5,759,921 | 6/1998 | Rostoker | 438/711 |

OTHER PUBLICATIONS

U.S. application No. 09/206,201, Chinn et al., filed Dec. 3, 1998.

* cited by examiner

Primary Examiner—William Powell
(74) Attorney, Agent, or Firm—Thomason Moser Patterson

(57) ABSTRACT

An apparatus and method for in-situ etching of a substrate comprising both a polysilicon layer and an overlying dielectric layer. An embodiment of the method comprises an anisotropic etch of the dielectric layer in a chamber using a first fluorinated gas (such as $CF_4$, $NF_3$, $SF_6$, and the like) as an etch gas to expose at least a portion of underlying polysilicon layer. Following the anisotropic etch and without removing the substrate from the chamber, i.e., in situ, an isotropic etch is preformed on the underlying polysilicon layer using a second fluorinated gas (such as $CF_4$, $NF_3$, $SF_6$, and the like) as an etch gas.

24 Claims, 4 Drawing Sheets

METHOD AND APPARATUS FOR SEQUENTIALLY ETCHING A WAFER USING ANISOTROPIC AND ISOTROPIC ETCHING

BACKGROUND OF THE DISCLOSURE

1. Field of Invention

The present invention relates generally to a method and apparatus for dry etching semiconductor wafers. More specifically, the invention relates to a method and concomitant apparatus for anisotropically etching a dielectric layer followed by in situ isotropic etching of a polysilicon layer.

2. Background of Invention

Trenches formed in semiconductor substrates have many uses in producing integrated circuits including isolation, capacitor formation, transistor formation, and so forth. One important use of trenches is in the formation of a trench capacitor as a storage node for a dynamic random access memory (DRAM) device. Trench capacitors are desirable because they occupy a relatively small area, while having large electrode surface area due to the depth of the trench used to form the capacitor.

FIGS. 1A through 1G collectively depict a portion of a conventional process of manufacturing the DRAM structure. In a first process chamber, a trench 12 is etched into a substrate 14 (FIG. 1A). The trench 12 is then lined with a first oxide 16 to condition the substrate 14 against dopant migration (FIG. 1B). The first oxide 16 is removed and a dielectric layer 18 is deposited (FIG. 1C). The trench 12 is filled and partially etched back with a first layer of polysilicon 20 (FIG. 1D). A second oxide 22 is deposited covering the first polysilicon layer 20 (FIG. 1E). The second oxide 22 is anisotropically etched in a second chamber to expose the underlying first layer of polysilicon 20 (FIG. 1F). A second layer of polysilicon 24 is deposited above the first layer of polysilicon 20 to fill the trench 12 (FIG. 1G).

Although the foregoing process yields a structure that is effectively used in a DRAM device, the number of process steps, and the number of chambers (both etch and deposition) required to produce the desired structure in the film stack is large. With such a large number of steps, and associated chambers required to execute those steps, the risk of device damage and contamination is correspondingly large as well. Additionally, the large number of steps places a burden on system throughput. For example, in order to anisotropically etch the second oxide to expose the underlying polysilicon, a parallel plate plasma reactor with capacitive coupling is generally used. Since prior art reactors are typically not capable of the selectivity needed to etch the underlying polysilicon without damaging nitride and oxide layers exposed in the film stack, a separate tool is typically used for the polysilicon etching step that follows in some specific process sequences. Etching the underlying polysilicon is performed in an etch reactor with isotropic etch capability. The need for switching chambers to etch the underlying polysilicon after the oxide etch increases the risk of damage to the film stack by exposing the wafer to additional environments and excessive handling.

Therefore, there is a need in the art for a method that clears a high aspect ratio trench, lined with a dielectric, having an anisotropic dielectric etch and an isotropic polysilicon etch sequentially performed in the same process chamber.

SUMMARY OF INVENTION

The disadvantages associated with the prior art are overcome by the present invention which facilitates in situ etching of a substrate comprising both a polysilicon layer and an overlying dielectric layer. The inventive apparatus and concomitant method comprises an anisotropic etch of the dielectric layer using a first fluorinated gas (for example, $CF_4$, $NF_3$, $SF_6$, and other gases comprising fluorine) as an etch gas to expose at least a portion of the underlying polysilicon layer. Following the anisotropic etch and without removing the substrate from the etch chamber, i.e., in situ, performing an isotropic etch on the exposed portions of the underlying polysilicon layer using a second fluorinated gas (for example, $CF_4$, $NF_3$, $SF_6$, and other gases comprising fluorine).

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

An embodiment of the present invention is a method of etching a substrate comprising a dielectric layer overlying a polysilicon layer. The embodiment of the present invention etches the dielectric to expose a polysilicon material that is subsequently etched. Both the dielectric and polysilicon etch occur sequentially within the same chamber of an etching system, i.e., in situ. The etch process of the present invention can be reduced to practice in a number of etching systems capable of etching both dielectric and polysilicon materials where the selectivity of the dielectric to the polysilicon can be varied. One such chamber is a Decoupled Plasma Source (DPS) Centura etch system available from Applied Materials, Inc., of Santa Clara, Calif.

Figure 1A:
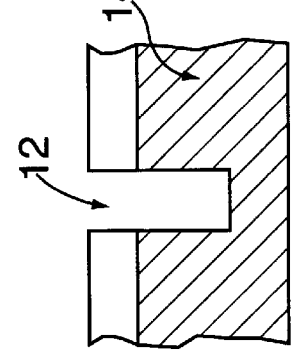
FIG. 1A through FIG. 1G depict profile elevations of a film stack in different stages of a conventional DRAM etch sequence known in the art.
Figure 1B:
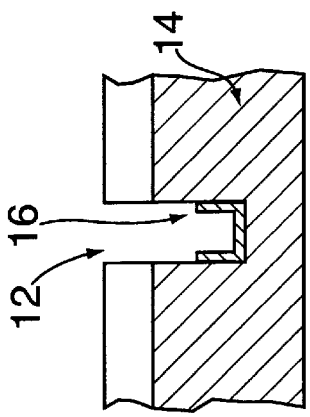
Figure 1C:
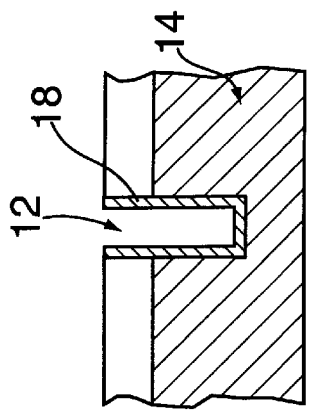
Figure 1D:
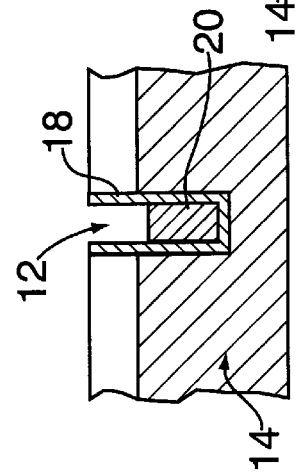
Figure 1E:
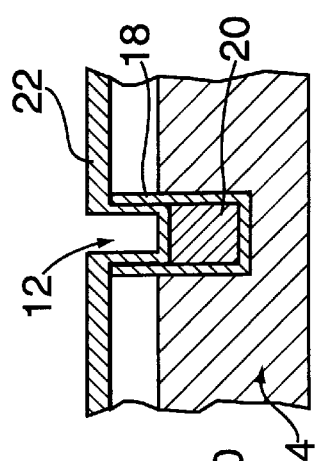
Figure 1F:
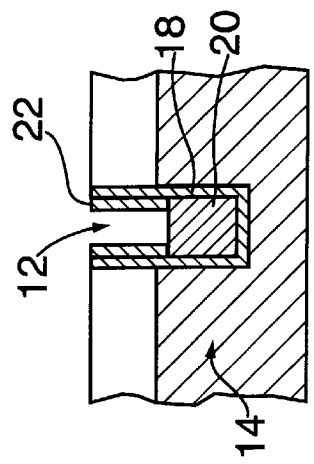
Figure 1G:
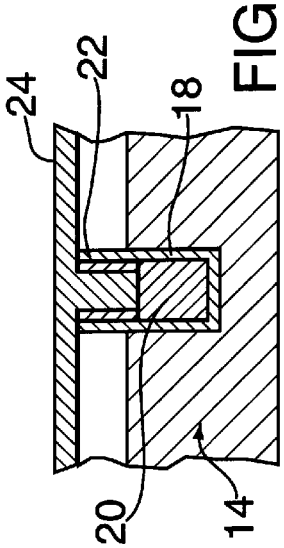
Figure 2:
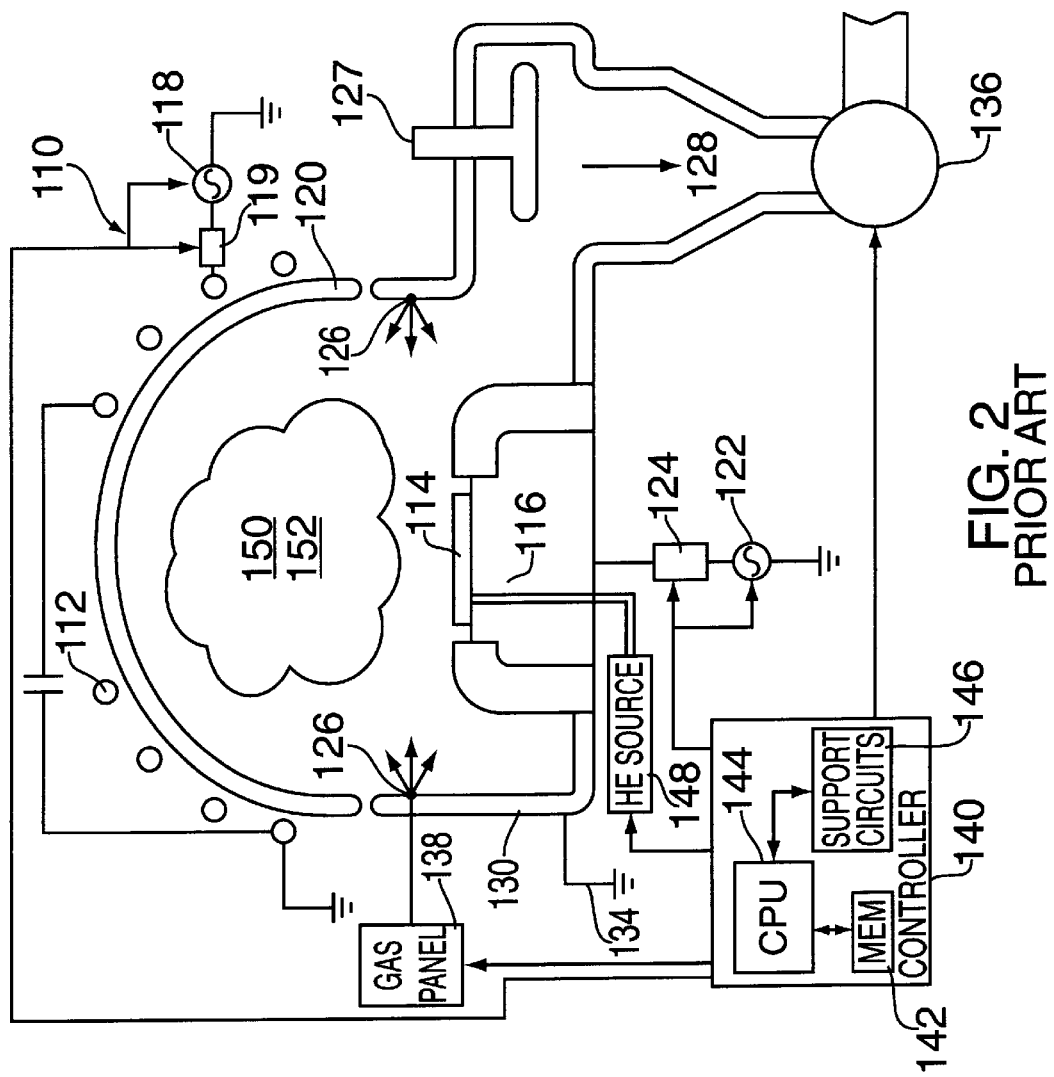
FIG. 2 is a schematic of a semiconductor process chamber in which an inventive method of FIG. 3 can be performed.

FIG. 2 depicts a schematic diagram of the DPS etch process chamber 110, that comprises at least one inductive coil antenna segment 112, positioned exterior to a dielectric, dome-shaped ceiling 120 (referred hereinafter as the dome 120). The antenna segment 112 is coupled to a radio-frequency (RF) source 118 that is generally capable of producing an RF signal having a tunable frequency of about 12.56 MHz. The RF source 118 is coupled to the antenna 112 through a matching network 119. The process chamber 110 also includes a substrate support pedestal (cathode) 116 that is coupled to a second RF source 122 that is capable of producing an RF signal having a frequency of approximately 13.56 MHz. The source 122 is coupled to the substrate support pedestal 116 though a matching network 124. The chamber 110 also contains a conductive chamber wall 130 that is coupled to an electrical ground 134. A controller 140 comprising a central processing unit (CPU) 144, a memory 142, and support circuits 146 for the CPU 144 is coupled to the various components of the DPS process chamber 110 to facilitate control of the etch process.

In operation, a semiconductor substrate 114 is placed on the substrate support pedestal 116 and gaseous components are supplied from a gas panel 138 to the process chamber 110 through entry ports 126 to form a gaseous mixture 150. The gaseous mixture 150 is ignited into a plasma 152 in the process chamber 110 by applying RF power from the RF sources 118 and 122 respectively to the antenna 112 and the substrate support pedestal 116. The pressure within the interior of the process chamber 110 is controlled using a throttle valve 127 situated between the chamber 110 and a vacuum pump 136. The temperature at the surface of the chamber wall 130 is controlled using liquid containing conduits (not shown) that are located within the walls 130 of the chamber 110. For example, the walls 130 can be maintained at about 65 degrees Celsius during processing.

The temperature of the substrate 114 is controlled by stabilizing the temperature of the support pedestal 116 and flowing helium gas from a source 148 to channels formed by the back of the substrate 114 and grooves (not shown) on the pedestal surface. The helium gas is used to facilitate heat transfer between the substrate 114 and the pedestal 116. For example, approximately 8 Torr of helium can be used. During the etch process, the substrate 114 is gradually heated by the plasma 150 to a steady state temperature. Using thermal control of both the dome 120 and the pedestal 116, the substrate 114 is maintained at a temperature of between about −40 to about 40 degrees Celsius, and preferably about 15 degrees Celsius.

To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk drive, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etch process 200 is generally stored in the memory 142, typically as a software routine 202. The software routine 202 may also be stored and/or executed by a second CPU (not shown) that is remotely located from the hardware being controlled by the CPU 144.

Figure 4:
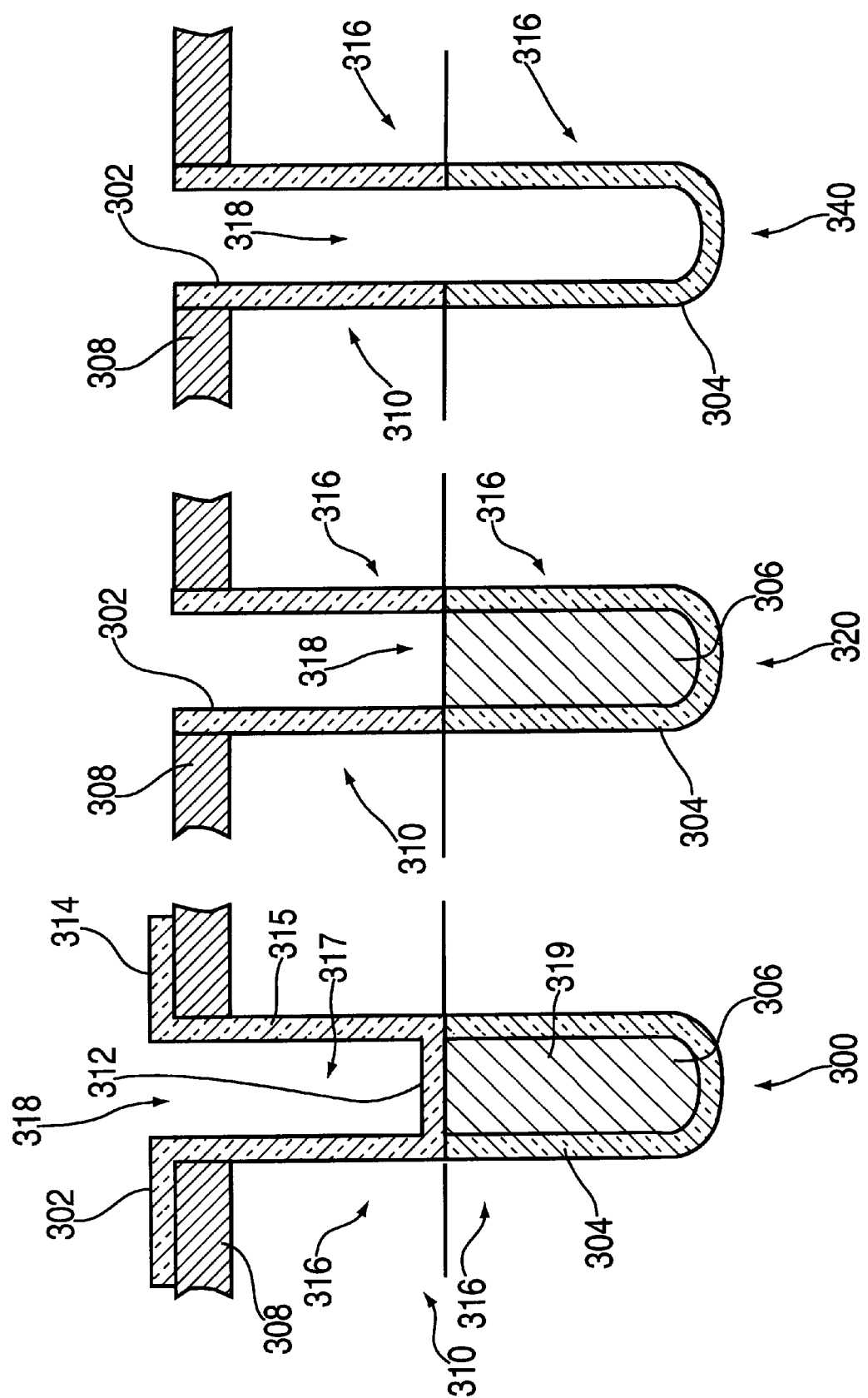

The etching method 200 can be illustratively reduced to practice on a film stack 310 contained on the wafer 114. The film stack 310 is depicted in FIG. 4 in a "pre-etch" state 300, an "intermediate" state 320 and a "post-etch" state 340. The film stack 310 as depicted in the "pre-etch" state 300 has a plurality of substrate layers 316 below a nitride layer 308. The film stack 310 additionally comprises a trench 318. The bottom section 319 of the trench 318 is lined with a first dielectric layer 304. The top section 317 of the trench 318 is lined with a second dielectric layer 302. The second dielectric layer 302 also has a portion 314 that covers the nitride layer 308, a lining portion 315 that lines the top section 317, and a section 312 that encapsulates an underlying layer of polysilicon 306 that fills the bottom section 319 of the trench 318. The "intermediate" state 320 and the "post-etch" state 340 are provided to facilitate the discussion of the etch process 200 detailed below.

Figure 3:
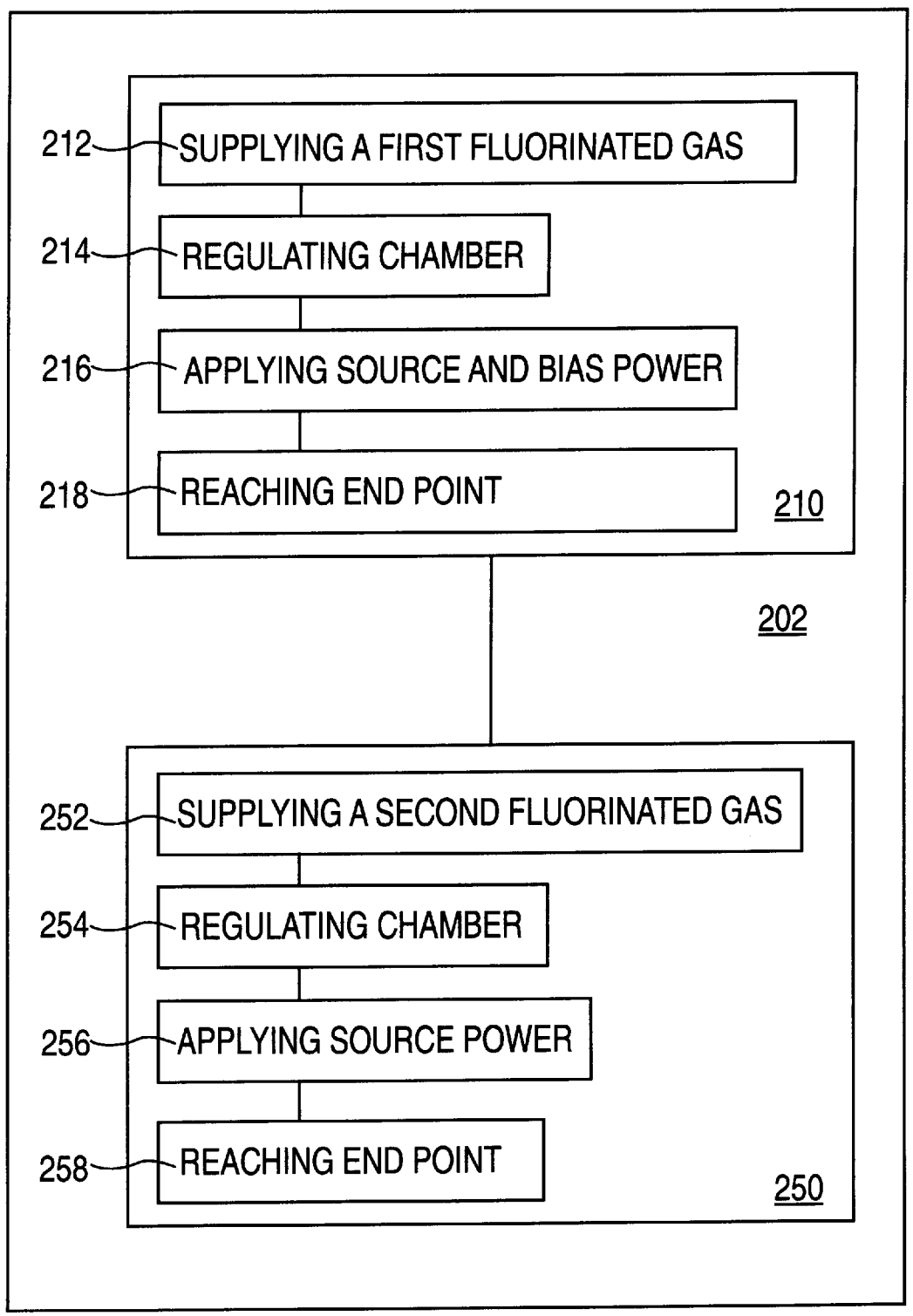
FIG. 3 is a block diagram depicting an inventive method of etching a dielectric layer followed by etching a polysilicon layer; and, FIG. 4 contains profile elevations of a film stack in different stages of the inventive method of FIG. 3.

The software routine 202 that executes the etch process 200 is discussed with respect to FIG. 2, FIG. 3 and FIG. 4. The software routine 202 is executed after the wafer 114 is positioned on the pedestal 116. The software routine 202 when executed by the CPU 144, transforms the general purpose computer into a specific process computer (controller) 140 that controls the chamber operation such that the etch process 200 is performed. Although the process of the present invention is discussed as being implemented as a software routine, some or all of the method steps that are disclosed herein may be performed in hardware as well as by the software controller. As such, the invention may be implemented in software as executed upon a computer system, in hardware as an application specific integrated circuit or other type of hardware implementation, or a combination of software and hardware.

The film stack 310 in the "pre-etch" state 300 is etched, for example, by first executing the anisotropic etch process 210. The anisotropic etch process 210 begins by supplying at least 10 sccm of a first fluorinated gas (for example, $CF_4$, $NF_3$, $SF_6$, and other gases comprising fluorine) to the chamber 110 in step 212. The chamber pressure is regulated to between about 5 to about 15 mTorr in step 214. Next in step 216, between about 500 to about 1000 Watts of RF power is applied to the antenna 112 and between about 50 to about 120 Watts of bias power is applied to the pedestal 116. The applied power ignites and sustains the plasma 152 and anisotropically etches the second dielectric layer 302. Of course, other sources of plasma ignition may also be used. The anisotropic etch process 210 ends once an end point is reached in step 218. Step 218 detects an emission wavelength with is indicative of the etch reaching the underlying layer of material. Optionally, the step 218 may include an over-etch.

The etch end point is identified by monitoring the magnitude of an optical emission. When the magnitude of the emission attains a predefined threshold level, the end point is detected, indicating that the desired etch depth has been achieved. One skilled in the art will appreciate that selecting different endpoints may be necessary when using different materials comprising the underlying layer, and for tailoring the etch characteristics for a particular application.

End point detection may be performed by using of an Send point detection system (e.g., an optical emission spectroscopy (OES) system) to detect when the etch process penetrates a dielectric layer (for example, an oxide layer) and begins etching an underlying layer such as a polysilicon layer. The underlying layer, when etched, releases material into the chamber atmosphere that has a signature wavelength discernible by the end point detection system. In one embodiment, an end point of 3865 Å is used along with an eight second over-etch to indicate the completion of the anisotropic etch process 210. Other methods of end point detection are readily available and can be readily incorporated into the process discussed herein.

As seen by comparison of the "pre-etch" 300 and intermediate state 320, the anisotropic etch process 210 removes the portion 314 and the section 312 of the first dielectric layer 302, exposing the nitride layer 308 and the underlying layer of polysilicon 306, while the lining portion 315 of the first dielectric layer 302 remains intact.

After completion of the anisotropic etch process 210, the plasma 152 is extinguished and the first fluorinated gas exhausted from the process chamber 110 before commencing the isotropic etch process 250. The isotropic etch process 250 begins by supplying at least 60 sccm of a second fluorinated gas (for example, $CF_4$, $NF_3$, $SF_6$, and other gases comprising fluorine) to the chamber 110 in step 252. Increasing the flow rate of the second fluorinated gas will increase the selectivity of the isotropic etch process 250. The chamber pressure is regulated to maintain at least about 45 to mTorr in step 254. Pressures of about 45 to about 60 mTorr and about 200 mTorr contribute to better selectivity of the isotropic etch process 250. Next in step 256, between about 500 to about 1000 Watts of RF power is applied to the antenna 112. The applied power ignites and sustains the plasma 152 and isotropically etches the polysilicon 306. Of course, other ignition sources may be used. The isotropic etch process 250 ends once an end point is reached in step 258. In one embodiment, an end point of 7038 Å is used to indicate the completion of the isotropic etch process 250.

In one illustrative embodiment, the etch process 200 is reduced to practice by:

supplying about 80 sccm of $CF_4$ (step 212);

regulating the chamber pressure to about 10 mTorr (step 214);

applying source and bias power of about 600 and about 90 Watts, respectively (step 216);

reaching an etch endpoint by detecting a wavelength of 3865 Å coupled with an eight second over-etch (step 218);

supplying about 360 sccm of $SF_6$ (step 252); regulating the chamber pressure between about 45–60 Torr (step 254);

applying source power of about 700 Watts (step 256); and, reaching an etch endpoint by detecting a wavelength of 7038 Å (step 258).

Alternately, the anisotropic etch process 210 and the isotropic etch process 250 may be condensed by supplying the second fluorinated gas to the chamber simultaneously with the termination of the flow of the first fluorinated gas after the end point is reached in step 218. The bias power is removed and the source power is changed to the settings disclosed in step 256 (i.e., between about 500 to about 1000 Watts). At this point, the isotropic etch is performed until the end point is reached (step 258).

Although the present invention is disclosed illustratively using a DPS process chamber, the invention may be practiced in other etching equipment wherein the processing parameters may be adjusted to achieve acceptable etch characteristics by those skilled in the arts by utilizing the teachings disclosed herein without departing from the spirit of the invention.

What is claimed is:

1. Apparatus for etching a substrate comprising:
   a processing chamber, said chamber comprising at least one inductive coil antenna disposed proximate said chamber, a substrate support pedestal disposed within said chamber and having at least one embedded electrode, and a process gas inlet;
   a gas panel coupled to said process gas inlet for supplying a first fluorinated gas during an anisotropic etch of a dielectric layer on said substrate and for supplying a second fluorinated gas during an isotropic etch of an underlying polysilicon layer, said isotropic etch occurring after said anisotropic etch without removal of said substrate from said processing chamber;
   a first power source coupled to said inductive coil antenna; and
   a second power source coupled to said embedded electrode.

2. The apparatus of claim 1 wherein the anisotropic etch further comprises forming a plasma in said chamber from a first fluorinated gas.

3. The apparatus of claim 2 wherein the first fluorinated gas is selected from the group consisting of $CF_4$, $NF_3$ and $SF_6$.

4. The apparatus of claim 1 wherein the anisotropic etch step further comprises the step of:
   applying inductive source power of about 500 to about 1000 Watts to an inductively coupled antenna disposed about said chamber; and,
   applying bias power of about 50 to about 120 Watts to a pedestal disposed within said chamber.

5. The apparatus of claim 1 wherein the isotropic etch further comprises forming a plasma in said chamber from a second fluorinated gas.

6. The apparatus of claim 5 wherein the second fluorinated gas is selected from the group consisting of $CF_4$, $NF_3$, and $SF_6$.

7. The apparatus of claim 1 wherein the first fluorinated gas is $CF_4$; and,
   wherein the second fluorinated gas is $SF_6$.

8. The apparatus of claim 1 wherein the isotropic etch step further comprises the step of:
   applying inductive source power of about 500 to about 1000 Watts to an inductively coupled antenna disposed about said chamber.

9. A method of etching a substrate having an dielectric layer and a polysilicon layer, said polysilicon layer at least partially underlying said dielectric layer, comprising the steps of:
   anisotropically etching said dielectric layer to expose a portion of said polysilicon layer within a chamber; and
   isotropically etching said exposed portion of said polysilicon layer while said wafer remains within said chamber.

10. The method of claim 9 wherein the anisotropic etch further comprises forming a plasma in said chamber from a first fluorinated gas.

11. The method of claim 10 wherein the first fluorinated gas is selected from the group consisting of $CF_4$, $NF_3$ and $SF_6$.

12. The method of claim 9 wherein the anisotropic etch step further comprises the step of:
   applying inductive source power of about 500 to about 1000 Watts to an inductively coupled antenna disposed about said chamber; and,
   applying bias power of about 50 to about 120 Watts to a pedestal disposed within said chamber.

13. The method of claim 9 wherein the isotropic etch further comprises forming a plasma in said chamber from a second fluorinated gas.

14. The method of claim 13 wherein the second fluorinated gas is selected from the group consisting of $CF_4$, $NF_3$, and $SF_6$.

15. The method of claim 9 wherein the first fluorinated gas is $CF_4$; and,
   wherein the second fluorinated gas is $SF_6$.

16. The method of claim 9 wherein the isotropic etch step further comprises the step of:
   applying inductive source power of about 500 to about 1000 Watts to an inductively coupled antenna disposed about said chamber.

17. A computer readable medium containing a software routine that, when execute by a processor, cause a substrate processor to perform the steps of:
   anisotropically etching in a chamber a dielectric layer on a substrate to expose an underlying polysilicon layer; and
   isotropically etching said polysilicon layer without removing said substrate from said chamber.

18. The computer readable medium of claim 17 wherein the anisotropic etching step further comprises forming a plasma in said chamber from a first fluorinated gas.

19. The computer readable medium of claim 18 wherein the first fluorinated gas is selected from the group consisting of $CF_4$, $NF_3$ and $SF_6$.

20. The computer readable medium of claim 17 wherein the anisotropic etching step further comprises the step of:
- applying inductive source power of about 500 to about 1000 Watts to an inductively coupled antenna disposed about said chamber; and,
- applying bias power of about 50 to 120 Watts to a pedestal disposed within said chamber.

21. The computer readable medium of claim 17 wherein the isotropic etching further comprises in said forming a plasma in said chamber from a second fluorinated gas.

22. The computer readable medium of claim 21 wherein the second fluorinated gas is selected from the group consisting of $CF_4$, $NF_3$ and $SF_6$.

23. The computer readable medium of claim 17 wherein the first fluorinated gas is $CF_4$; and,
wherein the second fluorinated gas is $SF_6$.

24. The computer readable medium of claim 17 wherein the isotropic etch step further comprises the step of:
- applying inductive source power of about 500 to about 1000 Watts to an inductively coupled antenna disposed about said chamber.

* * * * *

UNITED STATES PATENT AND TRADEMARK OFFICE
CERTIFICATE OF CORRECTION

PATENT NO. : 6,221,784 B1  Page 1 of 1
DATED : April 24, 2001
INVENTOR(S) : Ursula Schmidt et al.

It is certified that error appears in the above-identified patent and that said Letters Patent is hereby corrected as shown below:

Column 6,
Line 2, delete "cause a substrate processor" and insert -- cause a substrate processing system --

Signed and Sealed this

Eleventh Day of June, 2002

*Attest:*

JAMES E. ROGAN
*Attesting Officer*  *Director of the United States Patent and Trademark Office*